United States Patent [19]

Becker

[11] Patent Number: 5,107,989
[45] Date of Patent: Apr. 28, 1992

[54] CONTAINER FOR PROTECTING ELECTRONIC COMPONENTS FROM STATIC CHARGES

[75] Inventor: Raymond P. Becker, Gurnee, Ill.

[73] Assignee: Conductive Containers, Inc., Northbrook, Ill.

[21] Appl. No.: 684,392

[22] Filed: Apr. 12, 1991

Related U.S. Application Data

[63] Continuation-in-part of Ser. No. 475,334, Feb. 5, 1990, Pat. No. 5,014,849.

[51] Int. Cl.$^5$ .............................................. B65D 85/42
[52] U.S. Cl. ........................................ 206/328; 383/1; 383/107; 383/116; 220/DIG. 30
[58] Field of Search ......................... 206/328; 383/116

[56] References Cited

U.S. PATENT DOCUMENTS

| 3,550,839 | 12/1970 | Clayton et al. ............... 383/116 |
| 4,154,344 | 5/1979 | Yenni, Jr. et al. ............ 206/328 X |
| 4,160,503 | 7/1979 | Ohlbach ....................... 206/328 |
| 4,211,324 | 7/1980 | Ohlbach ....................... 206/328 |
| 4,293,070 | 10/1981 | Ohlbach ....................... 206/328 |
| 4,482,048 | 11/1984 | Blodgett ....................... 206/328 |
| 4,610,353 | 9/1986 | Young .......................... 206/328 |
| 4,648,508 | 3/1987 | Neal et al. ................... 206/328 |
| 4,658,958 | 4/1987 | McNulty et al. .............. 206/328 |
| 4,684,020 | 8/1987 | Ohlbach ....................... 206/328 |
| 4,699,830 | 10/1987 | White .......................... 206/328 X |
| 4,706,438 | 11/1987 | Ohlbach ....................... 206/328 X |
| 4,707,414 | 11/1987 | Long et al. .................. 206/328 X |
| 4,770,923 | 9/1988 | Wasa et al. .................. 206/328 X |
| 4,883,172 | 11/1989 | Young .......................... 206/328 |
| 4,906,494 | 3/1990 | Babinec et al. ............... 206/328 X |
| 4,966,280 | 10/1990 | Bradford ...................... 206/328 |
| 4,987,997 | 1/1991 | Raszewski et al. ............ 206/328 |
| 5,014,849 | 5/1991 | Becker ......................... 206/328 |
| 5,041,319 | 8/1991 | Becker et al. ................ 206/328 X |

FOREIGN PATENT DOCUMENTS 3110150 5/1988 Japan ................................ 383/116

Primary Examiner—William I. Price
Attorney, Agent, or Firm—Arnold, White & Durkee

[57] ABSTRACT

A container for packaging electronic components which are susceptible to damage from electrostatic discharge or fields comprises a container made of paperboard or paper having an electrically conductive coating of electrostatic shielding material on the exterior surface thereof, and a coating of inorganic non-carbonaceous electrostatic dissipative material on the interior surface thereof. The electrically conductive coating preferably has an electrical surface resistivity of less than about $10^5$ ohms/square, and the inorganic, non-carbonaceous, electrostatic dissipative coating has an electrical surface resistivity of greater than about $10^5$ ohms/square. The electrostatic shielding material is preferably a carbonaceous material, and the non-carbonaceous, electrostatic dissipative material preferably comprises particles of amorphous silica or silica-containing material coated with antimony-doped tin oxide.

16 Claims, 1 Drawing Sheet

CONTAINER FOR PROTECTING ELECTRONIC COMPONENTS FROM STATIC CHARGES

CROSS REFERENCE

This application is a contiuation-in-part of U.S. patent application Ser. No. 07/475,334, field on Feb. 5, 1990, now U.S. Pat. No. 5,014,849 and entitled ELECTROSTATIC PROTECTIVE CONTAINER FOR ELECTRICAL COMPONENTS.

FIELD OF THE INVENTION

The present invention relates generally to containers for electronic components, devices and assemblies and, more particularly, to containers for protecting such electronic components, devices and assemblies from electrostatic discharges and from the fields that emanate from electrostatic charges.

BACKGROUND OF THE INVENTION

Heretofore, a wide variety of conductive materials have been used as coatings or fillers for various packaging materials to protect electronic components packaged therein from electrostatic discharges. For example, carbonaceous material such as particulate carbon black and graphite have been used as fillers in polymeric bags and films for packaging electronic components, and the same carbonaceous materials have been used to form coatings on paperboard boxes for the same purpose. Examples of such coated paperboard boxes are described in Ohlbach U.S. Pat. Nos. 4,160,503; 4,211,324 and 4,293,070. It is generally preferred to coat both the interior and the exterior surfaces of such boxes with the conductive material. It has also been proposed to use metal powders in a similar manner.

One of the problems encountered with carbonaceous coatings and metal powders is that the particulate carbonaceous or metallic material tends to slough off the packaging material, which can cause serious problems if the loose conductive particles happen to be deposited on sensitive electronic components. In an attempt to avoid such sloughing, coatings of such materials are sometimes sealed with a thin protective coating of another material.

Another problem with conductive coatings formed from carbonaceous materials is that it is difficult to control the surface resistivity of such coatings. Carbonaceous materials tend to produce coatings which have extremely low surface resistivities, and attempts to increase the surface resistivity by using smaller amounts of the conductive material result in discontinuities which render the coating non-conductive, or produce coatings having non-uniform properties over the surface area of a given container.

OBJECTS AND SUMMARY OF THE INVENTION

It is a primary object of this invention to provide an improved container which provides excellent protection against electrostatic discharges and fields, while at the same time reducing contamination of the package items from sloughing of the conductive material from the interior surface of the container.

Another important object of this invention is to provide an improved container which provides protection against electrostatic discharges and in which the primary discharge path is on the exterior surface of the container, so that the discharge currents are spaced away from the package items by at least the thickness of the packaging material, and also take the path of least resistance to ground.

A further object of the invention is to provide such improved packaging materials whose surface resistivities are relatively insensitive to humidity levels, even when the interior coating has a relatively high resistivity.

It is yet another object of the invention to provide such improved containers which are biodegradable.

A still further object of this invention is to provide such an improved container which can be manufactured economically so that it is feasible for use in mass production operations.

Other objects and advantages of the invention will be apparent from the following detailed description and the accompanying drawings.

In accordance with the present invention, the foregoing objectives are realized by providing a container for packaging electronic components which are susceptible to damage from electrostatic discharges or fields, the container comprising one or more layers of paper or paperboard and having a coating of electrostatic shielding material on the exterior surface thereof, and a coating of inorganic, non-carbonaceous, electrostatic dissipative material on the interior surface thereof. In the preferred embodiment, the coating on the exterior surface of the container is a carbonaceous material having a surface resistivity of less than about $10^4$ ohms/square, and the non-carbonaceous coating on the interior surface of the container has a surface resistivity of greater than about $10^5$ ohms/square. In a particularly preferred embodiment, the non-carbonaceous material is particulate silica coated with antimony-doped tin oxide.

Because the non-carbonaceous material used to form the protective coating on the interior surface of the container has a relatively high surface resistivity, this material is not likely to damage the package electronic components through discharges from charged components or through contamination of components, even if particles of the material become dislodged from the interior surface of the container. Furthermore, the electrostatic dissipative material can be made to adhere securely to the surface of the paper or paperboard. In addition, by providing a much lower surface resistivity on the exterior surface of the container, by the use of carbonaceous materials in that coating, the primary discharge path for electrostatic charges is along the exterior surface of the container, rather that the interior surface, so that the discharge currents are spaced away from the packaged items by at least the thickness of the packaging material, and take the path of least resistance to ground. This further reduces the risk of any damage to the packaged electronic items by inadvertent conduction of the discharge current back into the items being protected, rather than going directly to ground.

Although the cost of non-carbonaceous materials which are electrically conductive is generally much greater than the cost of carbonaceous materials, only a small amount of the non-carbonaceous material is needed to achieve the high surface resistivities provided on the interior surface of the container in accordance with this invention. Thus, the cost of the interior coating can still be approximately the same as the cost of coating the interior surface with carbonaceous material.

DETAILED DESCRIPTION OF THE PREFERRED EMBODIMENTS

Figure 1:
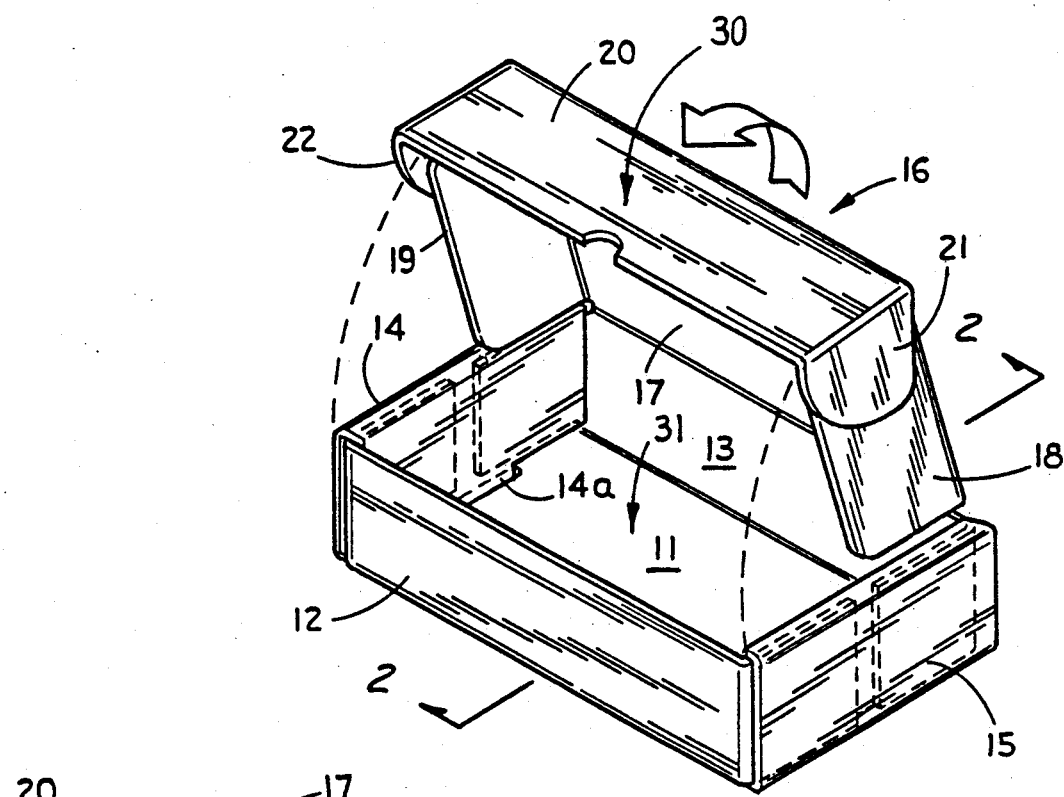
FIG. 1 is a perspective view of a corrugated fiberboard container embodying the present invention.

While the invention is susceptible to various modifications and alternative forms, a specific embodiment thereof has been shown by way of example in the drawings and will be described in detail herein. It should be understood, however, that it is not intended to limit the invention to the particular forms disclosed. On the contrary, the intention is to cover all modifications, equivalents and alternatives falling within the spirit and scope of the invention as defined by the appended claims.

Figure 2:
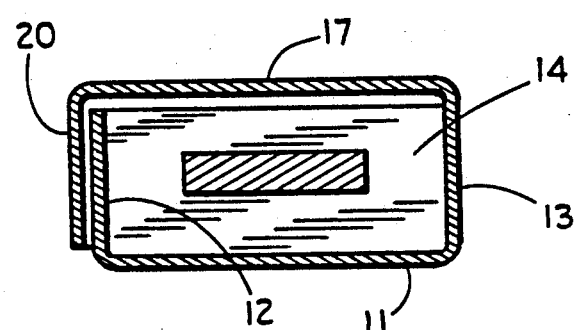
FIG. 2 is a section taken generally along line 2—2 in FIG. 1.

Turning now to the drawings and referring first to FIG. 1, there is shown a paperboard box which has both its exterior and interior surfaces covered with coatings of materials which protect electronic components packaged therein from electrostatic discharges and fields. Although the container may take a wide variety of different forms, the particular embodiment illustrated in FIGS. 1 and 2 is a conventional box configuration formed from a single sheet of paperboard. This box includes a bottom panel 11, front and rear walls 12 and 13, a pair of end walls 14 ad 15 and a lid 16. Each of the end walls 14 and 15 is formed from two panels of the paperboard blank, with the lower edge of the inside panel of each end wall forming a depending tab 14a or 15a which fits into a corresponding aperture in the bottom panel 11 so as to lock the end walls in place. The two panels of each end wall 14 and 15 form an interior cavity which receives end tabs from both the front wall 12 and the rear wall 13; and these end tabs are locked in place within the end walls after the depending tabs 14a and 15a on the inside panels of the end walls 14 and 15 have been inserted into the corresponding apertures in the bottom panel 11.

The lid 16 of the illustrative box includes a top panel 17 which is an extension of the rear wall 13. Depending from the top panel 17 are a pair of side flaps 18 and 19 which fit along the inside surfaces of the end walls 14 and 15, respectively, and a front flap 20 which extends along the outer surface of the front panel 12 when the box is closed. At opposite ends of the front flap 20 are a pair of tabs 21 and 22 which can be tucked into the cavities formed between the two panels of each end wall 14 and 15, thereby holding the lid 16 securely in the closed position.

The coating on the exterior surface of the illustrative box is electrically conductive so as to provide a conductive path to ground for dissipating any electrostatic charges on the box whenever it comes into contact with a grounded surface. When the box is not in contact with a grounded surface, the conductive coating forms a Faraday cage, which is recognized in the art as a substantially enclosed conductive structure. The effect of the Faraday cage is to enable an electrostatic charge on the surface of the box to circulate about and dissipate from the surface of the box into the surrounding atmosphere when the box is not in contact with a grounded surface.

In accordance with one important aspect of the present invention, the conductive coating 30 on the exterior surface of the box has a surface resistivity that is sufficiently low to provide electrostatic shielding, and the coating 31 on the interior surface of the box is an inorganic, non-carbonaceous electrostatic dissipative material having a relatively high surface resistivity. Specifically, the coating on the exterior surface of the box is essentially the same carbonaceous material described in the aforementioned Ohlbach patents. The particulate carbonaceous material in the coating may be either carbon black or graphite which is mixed with a liquid carrier so that it may be uniformly applied to the entire surface of the paperboard blank with conventional coating equipment. The liquid carriers may be the same a those used in carbon-containing printing inks for paperboard.

The coating 30 is preferably applied to the paperboard blank before it is cut and folded into the shape of the box illustrated in FIG. 1. The concentration of particulate carbonaceous material in the liquid carrier will vary somewhat depending upon the particular carbonaceous material employed, the particular surface being coated, and the degree of surface resistivity desired in the coating, but in general the concentration of carbonaceous material will be within the range of from about 5 to about 20 percent by weight. The resulting deposit of carbonaceous material on the surface of the paperboard will typically be in the range of from about 1 to about 20 pounds per thousand square feet. The surface resistivity of the carbonaceous coating is preferably in the range of from about $10^2$ to about $10^4$ ohms/square so that it forms an effective electrostatic shield and also quickly dissipates any charge that forms on, or comes into contact with, the coated surface. If desired, the conductive coating may be over-coated with a protective sealant, which is usually transparent.

Instead of applying the carbonaceous material as a surface coating, the carbonaceous material may be impregnated into the surface sheet of the paperboard prior to the fabrication of the paperboard. As is well known in the art, paperboard usually has a corrugated core laminated to a pair of opposed surface sheets, and it is possible to impregnate one of the surface sheets with the carbonaceous material before it is laminated to the corrugated core.

The coating 31 on the interior surface of the paperboard container is formed from an inorganic, non-carbonaceous material which enables the interior coating to have a much higher surface resistivity than the exterior coating. It will be noted that the coatings 30 and 31 on the inside and outside surfaces of the illustrative box are in contact with each other in several areas, thereby connecting the two coatings so that an electrostatic charge on the interior surface can be discharged via the conductive coating on the exterior surface. For the purposes of the present invention, it is preferred that the coating 31 have a surface resistivity within the range of from about $10^5$ to about $10^{12}$ ohms/square. Coatings with surface resistivities in this range are commonly referred to as "electrostatic dissipative" materials.

One particularly suitable material for the interior coating is "ZELEC ECP," which is an electroconductive powder commercially available from E.I. duPont deNemours and Co., Deepwater, N.J. This electroconductive powder comprises fine crystallites of antimony-doped tin oxide densely layered onto the surface of particles of amorphous silica or silica-containing material. The crystallites are dispersed in such a fashion that they form a dense layer on the silica surface, as described in more detail in published European patent application Ser. No. 359,569, dated Mar. 21, 1990, by E.I. duPont deNemours Co., Ser. No. 89309354 filed Sept. 14, 1989. By controlling the amount of electroconductive powder in the coating applied to the interior surface of the paperboard, the surface resistivity of the interior coating may be accurately controlled. A coating having a surface resistivity within the range of $10^5$ to $10^{12}$ ohms/square requires a relatively small amount of the electroconductive powder and, therefore, is relatively inexpensive.

The silica particles covered with antimony-doped tin oxide can be applied in accurately controllable densities, which enables the surface resistivity of the resulting coating 31 to be accurately controlled. For most applications, a surface resistivity of $10^8$ ohms/square will provide the required protection, and such a coating requires only 0.6 lbs/1000 ft$^2$ of the particulate material. Thus, such a coating is practical even for large volume applications. This coating material is also virtually insensitive to humidity levels, i.e., its surface resistivity changes only negligibly with changes in the relative humidity of the ambient air, and can be readily mixed with different pigments to form attractive coatings of virtually any desired color. In addition, paper or paperboard containers coated with such material are biodegradable. Moreover, there is virtually no risk of arcing between such a coating and the packaged article, as can occur when a highly conductive surface on the interior of a container "draws" an arc from a charged surface.

One of the most significant properties of the preferred coating containing the antimony-doped tin oxide is that is bonds firmly to a paper or paperbroad substrate and does not slough off. Consequently, there is virtually no risk of contamination of packaged electronic components by the sloughing of conductive particles. The risk of sloughing is further reduced by the extremely small amount of conductive particulate material needed to provide the desired surface resistivity of $10^5$ to $10^{12}$ ohms/square.

Figure 3:
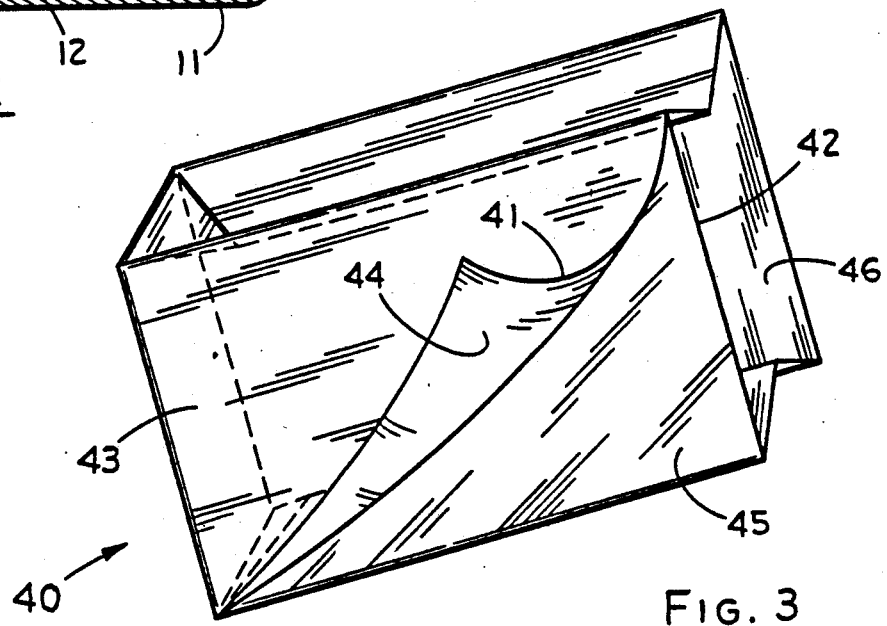
FIG. 3 is a perspective view of a multi-layer bag embodying the invention, with the various layers peeled apart at one end to show the layers more clearly.

In a modified embodiment of the invention illustrated in FIG. 3, a container made in accordance with the present invention is in the form of a bag 40 comprising multiple plies 41 and 42 with both the outer and inner surfaces of the outer ply 41, and the outer surface of the inner ply 42, coated with electrically conductive coatings 43, 44 and 45 of electrostatic shielding material, and the inner surface of the inner ply 42 coated with an inorganic, non-carbonaceous electrostatic dissipative material 46. The electrostatic shielding coatings 43, 44 and 45 may be the same as the coating 30 described above for the exterior of the box illustrated in FIGS. 1 and 2, and the electrostatic dissipative coating 46 may be made of the same material described above for the coating 31 on the box of FIGS. 1 and 2. It has been found that two or more envelopes of electrostatic shielding material around a sensitive electronic component provide more protection than a single envelope. For example, if a single envelope dissipates 90% of an electrostatic charge or field originating from a source outside the outer envelope, the second envelope will then dissipate approximately 90% of the remaining 10%, so that the total dissipation by the two envelopes combined is approximately 99%.

Although the illustrated bag has been shown with electrostatic shielding coatings on both of the opposed surfaces of the two plies of the bags, i.e., the inner surface of the outer ply and the outer surface of the inner ply, significant protection may also be afforded by a bag which has only one of these two coatings of electrostatic shielding material. Also, for certain applications it may be desirable to coat one of these two surfaces with an insulating material, to provide further protection against the conduction of electrical currents through the two plies of the bag. It will also be appreciated that this embodiment of the invention is not limited to the use of only plies, but is equally applicable to any desired number of plies of paper, so as to provide any desired number of envelopes of electrostatic shielding material, insulating material or electrostatic dissipative material around the article being protected.

In one particular embodiment of the invention that is preferred for high-volume, low-cost applications, a single-ply paper bag is made from paper having an electrically conductive coating of electrostatic shielding material on the outer surface, a coating of non-carbonaceous electrostatic dissipative material on the inner surface, and having the inner and outer surfaces bonded to each other to form at least one of the seams of the bag. The bonding of the inner and outer surfaces is effected with an adhesive that is readily penetrated by the particulate material in the respective coatings on the inner and outer surfaces, so that the two coatings are in electrically conductive contact with each other. This intimate and conductive connection between the inside and outside coatings ensures that any charges formed on the inside surface of the bag, due to rubbing engagement of that surface with the packaged contents, for example, are immediately transferred to the outside surface of the bag, and then dissipated. If desired, the conductive, preferably carbonaceous, coating on the outer surface of the bag may be coated with a sealant that premanently seals the conductive particles to the paper; this prevents sloughing of the conductive particles and ensures retention of the desired degree of conductivity of the outer coating.

I claim:
1. A container for packaging electronic components which are susceptible to damage from electrostatic discharge or fields, said container comprising paperboard or paper having an electrically conductive coating of electrostatic shielding material on the exterior surface thereof, and a coating of inorganic, non-carbonaceous electrostatic dissipative material on the interior surface thereof.

2. The container of claim 1 wherein said electrically conductive coating has an electrical surface resistivity of less than about $10^5$ ohms/square, and said inorganic, non-carbonaceous, electrostatic dissipative coating has an electrical surface resistivity of greater than about $10^5$ ohms/sqaure.

3. The container of claim 1 wherein said electrostatic shielding material is a carbonaceous material.

4. The container of claim 3 wherein said carbonaceous material is particulate carbon black or.

5. The container of claim 1 wherein said non-carbonaceous, electrostatic dissipative material comprises particles of amorphous silica coated with antimony-doped tin oxide.

6. The container of claim 1 wherein said exterior and interior coatings are connected so that an electrostatic charge on said interior surface can be discharged via said conductive coating on said exterior surface.

7. The container of claim 1 wherein substantially the entire exterior and interior surfaces of said container are covered by the respective coatings.

8. The container of claim 1 wherein said interior coating contains less than about 0.6 lbs/1000 square feet of particulate conductive material.

9. The container of claim 1 wherein said exterior coating has an electrical surface resistivity within the range of from about $10^2$ to about $10^4$ ohms/square, and said interior coating has an electrical surface resistivity within the range of from about $10^5$ to about $10^{12}$ ohms/square.

10. The container of claim 1 wherein said container is a biodegradable paperboard box.

11. The container of claim 1 wherein said container is a biodegradable paper bag.

12. A paper bag for packaging electronic components which are susceptible to damage from electrostatic discharge or fields, said bag comprising:
  multiple plies of paper,
  the outer surface of the outermost ply of paper being coated with an electrically conductive coating of electrostatic shielding material,
  the inner surface of the innermost ply of paper being coated with an inorganic, non-carbonaceous electrostatic dissipative material, and
  at least one of the opposed interior surfaces of an adjacent pair of said plies being coated with an electrically conductive coating of electrostatic shielding material.

13. The paper bag of claim 12 wherein at least one of the opposed surfaces of adjacent plies of paper is coated with an electrically conductive coating of electrostatic shielding material.

14. A paper bag for packaging electronic components which are susceptible to damage from electrostatic discharge or fields said bag comprising:
  a single ply of paper that is coated on its outer surface with an electrically conductive coating of electrostatic shielding material,
  and is coated on its inner surface with an inorganic, non-carbonaceous electrostatic dissipative material, and
  the coated inner and outer surfaces of said paper being handed to each other to form seam of the bag and to electrically connect said coatings on said inner and outer surfaces.

15. The container of claim 3 wherein said carbonaceous material is particulate graphite.

16. The container of claim 1 wherein said non-carbonaceous, electrostatic dissipative material comprises particles of silica-containing material coated with antimony-doped tin oxide.

* * * * *